United States Patent [19]

Fukuda et al.

[11] 3,999,131
[45] Dec. 21, 1976

[54] CHANNEL-SELECTING APPARATUS FOR MULTICHANNEL RECEIVERS

[75] Inventors: Takeo Fukuda, Yokohama; Kenichi Torii, Tokyo, both of Japan

[73] Assignee: Tokyo Shibaura Electric Co., Ltd., Kawasaki, Japan

[22] Filed: Oct. 24, 1975

[21] Appl. No.: 625,381

Related U.S. Application Data

[63] Continuation of Ser. No. 415,786, Nov. 14, 1973, abandoned.

[30] Foreign Application Priority Data

Nov. 14, 1972 Japan .................. 47-114117

[52] U.S. Cl. .................. 325/453; 325/465; 325/470; 334/15
[51] Int. Cl.$^2$ .................. H04B 1/26;
[58] Field of Search ............. 325/453, 457, 459; 325/464, 465, 468–470; 334/11, 14–16

[56] References Cited
UNITED STATES PATENTS

| | | | |
|---|---|---|---|
| 3,518,586 | 6/1970 | Nilssen et al. | 334/11 |
| 3,651,469 | 3/1972 | Keese | 325/470 |
| 3,748,645 | 7/1973 | Kawashima | 325/465 |
| 3,778,736 | 12/1973 | Sakamoto | 325/465 |

*Primary Examiner*—Robert L. Griffin
*Assistant Examiner*—Jin F. Ng
*Attorney, Agent, or Firm*—Oblon, Fisher, Spivak, McClelland & Maier

[57] ABSTRACT

A channel-selecting apparatus in which is designed to determine the oscillation frequencies of a local oscillator and/or the tuning frequencies of a radio-frequency amplifier for all channels by varying analogue dc voltages being applied to a frequency control element such as a variable capacitance diode included in the oscillator and/or the amplifier in accordance with channel selective operation. Digital memory devices are provided each of which previously stores digital information representing the different predetermined analogue voltages assigned to all the channels being applied to the frequency control element. Digital information stored in the memory devices is read out upon selective operation of any of channel selection switches each coupled with the corresponding one of bistable multivibrators. A series of digital signals thus obtained are supplied to the frequency control element after being converted into a predetermined analogue voltage for the selected channel by a digital-to-analogue converter, whereby any of all the channels by selective operation of any of the channel selection switches can be selected.

An automatic channel selection only for the channels now on the air is further effected by a function switch and a clock pulse oscillator designed to initiate the supply of shift or clock pulses to the bistable multivibrators collectively constituting a shift register upon operation of the function switch and terminate the supply upon reception of a first broadcasting wave after the function switch is manipulated.

7 Claims, 25 Drawing Figures

FIG. 5A OUTPUT OF THE ONE-SHOT MULTIVIBRATOR 44

FIG. 5B OUTPUT OF THE CLOCK PULSE OSCILLATOR 52

1

CHANNEL-SELECTING APPARATUS FOR MULTICHANNEL RECEIVERS

This is a continuation, of application Ser. No. 415,786 filed Nov. 14, 1973, now abandoned.

BACKGROUND OF THE INVENTION

This invention relates to a channel-selecting apparatus for use in various multichannel receivers such as television (TV) or radio receiver, and more particularly to an improved channel-selecting apparatus of a mechanical contactless or electrically tuned type.

The prior art channel-selecting apparatus may be exemplified by a so-called mechanical contact type tuner adapted to select the oscillation frequencies of a local oscillator and/or the tuning frequencies of a radio-frequency (hereinafter referred to as RF) amplifier for all channels using a mechanical contact switch assembly of a rotary or push button type.

However, such mechanical contact type tuner has the drawback that the mechanical contacts are gradually worn away during long use, reducing their mutual connection.

For this reason, a so-called mechanical contactless or electrically tuned type tuner in which uses a frequency control element such as variable capacitance diode in place of the mechanical contact switch assembly has recently been more faborably accepted. The mechanical contactless type tuner is designed to determine the oscillation frequency of a local oscillator and/or the tuning frequency of an RF amplifier for each channel by electrically controlling voltages to be applied to the frequency control element.

However, the prior art electrically tuned type channel-selecting apparatus is generally adapted to previously adjust analogue dc voltages for all the channels being applied to such frequency control element by individual voltage control elements such as variable resistors and change the respective voltages in accordance with the channel selective operation.

Accordingly, the prior art electrically tuned type channel-selecting apparatus has the drawback that not only the requirement of a voltage control element such as a variable resistor for each channel presents difficulties in making the circuit of an entire channel-selecting apparatus suitable for integration, but also adjustment of the voltage control element consumes a relatively long time, resulting in the low yield and high cost of the apparatus.

It is, therefore, the object of this invention to provide a channel-selecting apparatus for multichannel receivers which eliminates the necessity of adjusting analogue dc voltage for each channel to be impressed on a frequency control element such as a variable capacitance diode for electrical control of the oscillation frequency of a local oscillator and/or the tuning frequency of an RF amplifier for each channel and in consequence has its electric circuit construction adapted for easy integration and moreover attains higher means production at low cost.

SUMMARY OF THE INVENTION

A channel-selecting apparatus according to this invention is characterized by comprising a channel selection switch device capable of selecting at least individual channels; a plurality of digital memory devices coupled with said channel selection switch device which are previously stored with digital information representing the different predetermined analogue dc voltages for all the channels to be applied to a frequency control element such as a variable capacitance diode for electrical control of the oscillation frequency of a local oscillator and/or the tuning frequency of a radio-frequency amplifier for each channel and from which the stored digital information for the selected channel is read out upon selective operation of said channel selection switch device; and a digital-to-analogue converter coupled with said plurality of digital memory device and said frequency control element to convert a series of binary coded signals for the selected channel read out from said memory devices into a predetermined analogue voltage assigned to the selected channel and supply in the converted analogue voltage for the selected channel to said frequency control element.

The channel-selecting apparatus so constructed has the advantage that any of all the channels can be selected only by the operation of said channel selection switch device, without the necessity of previously adjusting analogue voltage for each channel being applied to said frequency control element by an individual voltage control element such as a variable resistor.

According to this invention, an automatic channel selection only for the channels now on the air is further effected, in addition to the aforesaid individual channel selection, by a function switch and a clock pulse oscillator designed to initiate the sequential supply of shift or clock pulses to said plurality of digital memory devices upon operation of the function switch and terminate the supply upon reception of a first broadcasting wave after the function switch is operated.

PREFERRED EMBODIMENT OF THE INVENTION

A preferred embodiment of the channel-selecting apparatus according to this invention will now be described, without limiting the scope of this invention, with reference to the accompanying drawings by exemplifying 12-channel-VHF (permissibly UHF) TV receivers (in Japan, the frequency bands of 90 to 105 MHz and 170 to 220 MHz are alloted to the VHF TV receivers in which the frequency interval of the adjacent channels is ordinarilly selected at 6 MHz but only that between the seventh and eighth channels at 4 MHz).

Figure 1:
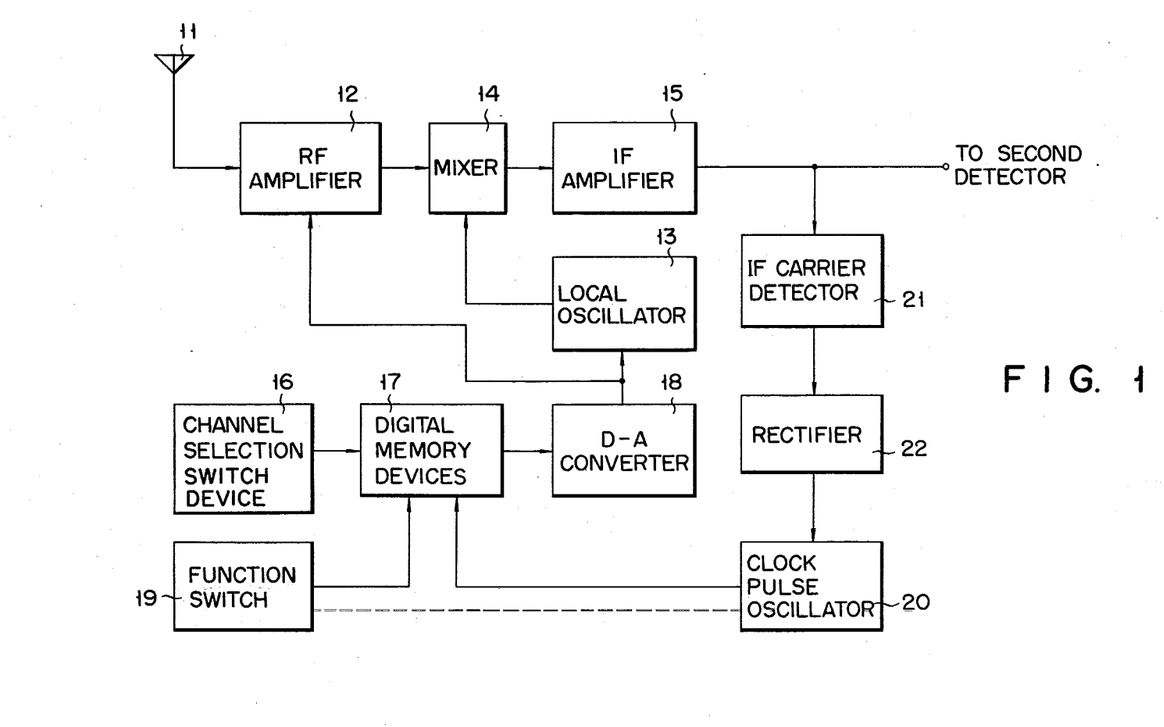
FIG. 1 shows a schematic block diagram of a channel-selecting apparatus in accordance with this invention.

FIG. 1 shows a schematic block diagram of a channel-selecting apparatus embodying this invention.

Electromagnetic waves including a video signal component and an aural signal component from each TV broadcasting station are received by a receiving antenna 11 constituting a first detector and then amplified appropriately by a tuned or non-tuned RF amplifier 12. Each TV signal thus received is supplied to a mixer 14 together with that oscillation signal which is generated by a local oscillator 13 with a predetermined higher (or lower) frequency (in Japan, 58.7 MHz) than the received signal upon the later described channel-selecting operation. The mixer 14 functions to convert, by the so-called beating, the frequency of the received signal obtained through the RF amplifer 12 into an intermediate frequency (hereinafter referred to as IF) whose central frequency is equal to a difference between the frequency of the signal delivered from the RF amplifier 12 and that of the oscillation signal from the local oscillator 13. The IF signal thus obtained is previously modulated by the video and at lock transmitting station aural signals, has its frequency centered at 58.75 MHz acting as a carrier for the video and aural signals, and is amplified appropriately by an IF amplifier 15. After the IF carrier component is rejected by a second detector (not shown), the amplified IF signal is reproduced, as is well known in the art, in a state separated into a desired video signal and aural signal.

The channel-selecting apparatus according to this invention is characterized by being arranged to determine the oscillation frequencies of the local oscillator 13 and/or the tuning frequencies of the RF amplifier 12 by electrically varying voltages being applied to a frequency control element Cv (see FIGS. 2B and 3B) such as a variable capacitance diode included in the oscillator 13 and/or the amplifier 12 in accordance with the later described channel-selecting operation, without the change-over of the mechanical contact switches as in the prior art.

The channel-selecting apparatus of this invention includes a plurality of digital memory devices 17 which are previously stored with digital information representing the different predetermined analogue dc voltages for the respective channels being applied to the frequency control element. Any of the first twelfth channels is through the selective operation of the channel selection switch device 16 by reading out from the memory devices 17 a series of digital signals corresponding to the selected channel.

The readout digital signal train is converted into a predetermined analogue voltage for the selected channel by an analogue-to-digital (hereinafter referred to as D-A) converter 18 and then supplied to the frequency control element Cv incorporated in the local oscillator 13 and/or the RF amplifier 12, whereby selection of the desired one of all the channels is completed.

The channel-selecting apparatus of this invention is further constructed as hereinunder described in order to enable an automatic channel selection only for the channels now on the air in addition to the aforesaid individual channel selection.

There are additionally provided a function switch 19 manipulated to select only the channels through which broadcasting electromagnetic waves are being transmitted and a clock pulse oscillator 20 designed to start or initiate the sequential supply of shift or clock pulses to the memory devices 17 upon operation of the function switch 19 and stop or terminate said supply in the hereinafter described timing. Connected between the output terminal of the IF amplifier 15 and the input or triggered terminal of the clock pulse oscillator 20 are an IF carrier detector 21, for example, a band pass filter and designed to filter out only the IF carrier component of 58.75 MHz included in the aforesaid IF signal derived from the IF amplifier 15 and a rectifier 22 adapted to rectify the IF carrier signal from the detector 21. Thus, the clock pulse oscillator 20 is intended to automatically terminate its supply of the clock pulses to the memory devices 17 when a first broadcasting wave obtained after the manipulation of the function switch 19 through the receiving antenna 11, the RF amplifier 12, the mixer 14 and the IF amplifier 15 is detected by the IF carrier detector 21 and then the IF carrier signal rectifier by the rectifier 22 is supplied to the triggered terminal of the clock pulse oscillator 20.

Consequently, a digital memory signal train for each channel is sequentially reat out from the memory device 17 under control of the clock pulses from the clock pulse oscillator 20, starting from the moment the function switch 19 is operated. Said reading operation is automatically terminated in timing with the impression of the IF carrier signal of the first broadcasting wave by manipulation of the function switch 19 on the clock pulse oscillator 20 through the IF carrier detector 21 and the rectifier 22, whereby channels now on the air can be automatically selected in turn each time the function switch 19 is operated.

Figure 2A:
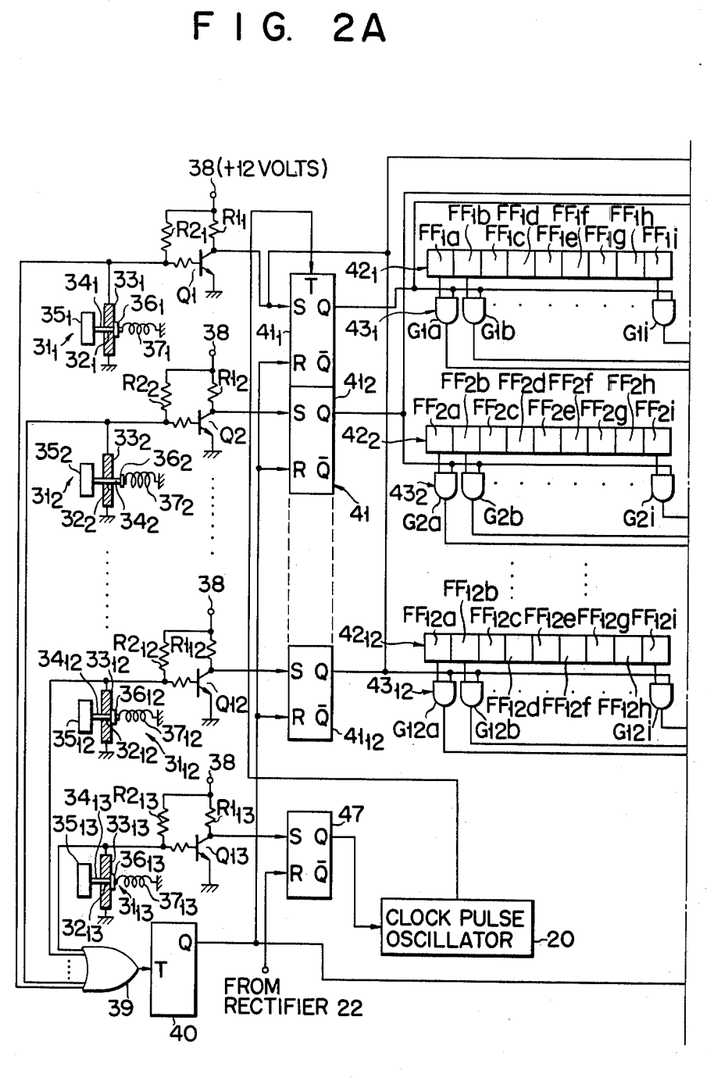
FIGS. 2A and 2B are a practical circuit arrangement of a main part of the channel-selecting apparatus shown in FIG. 1.
Figure 2B:
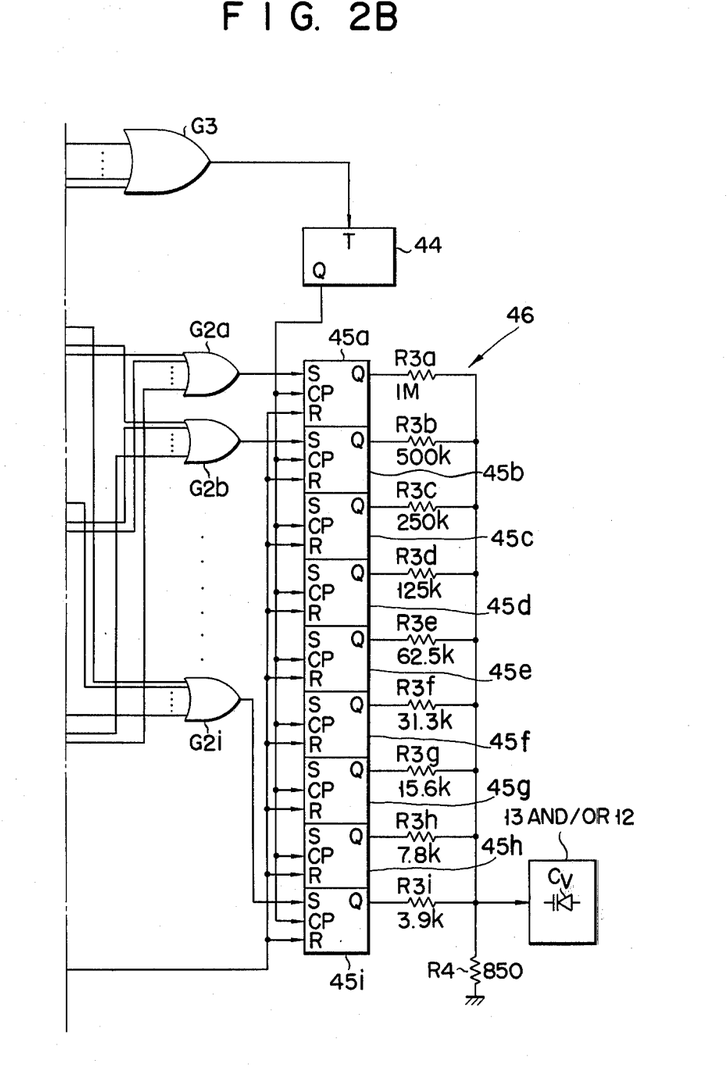

FIGS. 2A and 2B indicate a practical circuit arrangement of a main part of the channel-selecting apparatus shown in FIG. 1. The channel selection switch device 16 includes 12 channel selection switches $31_1$, $31_2$... $31_{12}$ constructed as hereinunder described. These channel selection switches $31_1$ to $31_{12}$ comprise guide members $33_1$, $33_2$... $33_{12}$ made of electric conducting material, mounted on the front pannel of a TV receiver cabinet (not shown) in an electrically insulated manner from each other and bored with through holes $31_1$, $32_2$ ... $33_{12}$ substantially at the center; mandrel rods $34_1$, $34_2$... $34_{12}$ made of electric insulating material and moved through the corresponding through holes $32_1$ to $32_{12}$ provided in the guide members $33_1$ to $33_{12}$ by the later described stroke in the lengthwise direction; push buttons $35_1$, $35_2$... $35_{12}$ made of electric insulating material and attached to the outer end of the corresponding mandrel rods $34_1$ to $34_{12}$; stopper rings $36_1$, $36_2$... $36_{12}$ made of electric conducting material and fixed to the inner end of the corresponding mandrel rods $34_1$ to $34_{12}$; and coiled spring $37_1$, $37_2$... $37_{12}$ whose outer ends are attached to the inner ends of the corresponding mandrel rods $34_1$ to $34_{12}$ and whose inner ends fixed within the TV receiver cabinet in alignment with the corresponding mandrel rods $34_1$ to $34_{12}$.

Thus these channel selection switches $31_1$ to $31_{12}$ are normally set in place with the corresponding mandrel rods $34_1$ to $34_{12}$ projected outermost. The stopper rings $36_1$ to $36_{12}$ of said switches are engaged with the inner walls of the corresponding guide members $33_1$ to $33_{12}$; and the push buttons $35_1$ to $35_{12}$ thereof are removed farthest from the corresponding guide members $33_1$ to $33_{12}$ by the action of the corresponding coiled springs $37_1$ to $37_{12}$ (see channel selection switches $31_1$ and $31_{12}$).

However, at the moment when any of the respective push buttons $35_1$ to $35_{12}$ is depressed, the channel selection switch (see $31_2$) corresponding to, for example, the depressed push button $35_2$ is set at the position where the mandrel rod $34_2$ of said switch is introduced innermost through the through hole $32_2$ of the guide member $33_2$ against the action of the coiled spring $37_2$ and where the push button $35_2$ of said switch is engaged with the outer wall of the guide member $33_2$. When the depressing force is released, the associated channel selection switch $31_2$ is again brought back to a state in which the mandrel rod $34_2$ is projected as described above by the action of the coiled spring $37_2$.

The channel selection switch device 16 further includes 12 normally OFF or nonconductive npn grounded-emitter transistors Q1, Q2 . . . Q12 rendered conductive only when the corresponding channel selection switches $31_1$ to $31_{12}$ are operated, said transistors Q1 to Q12 having their output terminals or collectors connected to a power supply 38, for example, of +12 volts via corresponding resistors $R1_1$, $R1_2$ . . . $R1_{12}$ and having their input terminals or bases returned to the power supply 38 via corresponding resistors $R2_1$, $R2_2$ . . . $R2_{12}$ and connected to ground via the corresponding guide members $33_1$ to $33_{12}$ of said switches; an OR gate 39 having a plurality (13, in this embodiment) of input terminals connected to the base of said transistors Q1 to Q12 and that of the later described transistor Q13; a monostable or one-shot multivibrator 40 triggered by an output signal from the OR gate 39; and twelve flip-flops or bistable multivibrators $41_1$, $41_2$ . . . $41_{12}$ reset by an output signal from the one-shot multivibrator 40 and set by output signals from the corresponding bistable multivibrator $41_1$ to $41_{12}$. These bistable multivibrators $41_1$ to $41_{12}$ jointly constitute a shift register 41 by cascade-connecting to each other and by connecting a Q output side of the last stage to an S input side of the first stage, in order to enable the later described automatic channel selection only for the channels now on the air.

Said digital memory devices 17 comprise twelve memory units each constituted by a desired number (9, in this embodiment) of parallel arranged flip-flops or binary circuits $FF_{1a}$ $FF_{1i}$, $FF_{2a}$ to $FF_{2i}$ . . . or $FF_{12a}$ to $FF_{12i}$ which are previously stored with a train of binary coded signals representing a predetermined individual analogue dc voltage allotted to each channel being applied to the frequency control element Cv provided in the local oscillator 13 and/or the RF amplifier 12; 12 AND gate arrangements $43_1, 43_2$. . . $43_{12}$ each constructed of AND gates $G_{1a}$ to $G_{1i}$, $G_{2a}$ to $G_{2i}$ . . . or $G_{12a}$ to $G_{12i}$ of the same number as the corresponding binary circuits $FF_{1a}$ to $FF_{1i}$, $FF_{2a}$ to $FF_{2i}$ . . . or $FF_{12a}$ to $FF_{12i}$ included in the memory unit $42_1$, $42_2$ . . . or $42_{12}$, said AND gates $G_{1a}$ to $G_{1i}$, $G_{2a}$ to $G_{2i}$ . . . or $G_{12a}$ to $G_{12i}$ each having an input terminal connected to either of two output terminals of the corresponding one of the binary circuits $FF_{1a}$ to $FF_{1i}$, $FF_{2a}$ to $FF_{2i}$ . . . or $FF_{12a}$ $FF_{12i}$ and having another input terminal connected to a q output side of the corresponding bistable multivibrator $41_1$, $41_2$ . . . or $41_{12}$; and nine OR gates $G_{2a}$, $G_{2b}$ . . . $G_{2i}$ of the same number as the binary circuits $FF_{1a}$ to $FF_{1i}$, $FF_{2a}$ to $FF_{2i}$ . . . or $FF_{12a}$ to $FF_{12i}$ each having twelve input terminals connected output terminals of the corresponding AND gates $G_{1a}$ to $G_{12a}$, $G_{1b}$ to $G_{12b}$ . . . or $G_{1i}$ to $G_{12i}$ included in the AND gate arrangements $43_1$ to $43_{12}$.

Said D-A converter 18 comprises an OR gates $G_3$ having twelve input terminals each connected to a Q output side of each of the bistable multivibrators $41_1$ to $41_{12}$; a one-shot multivibrator 44 triggered by an output signal from the OR gate $G_3$; nine flip-flops or bistable multivibrator $45a, 45b$ . . . $45i$ which is read in with output signals from the corresponding OR gates $G_{2a}$ to $G_{2i}$ included in the digital memory device 17 after being previously reset or cleared by an output signal from the one-shot multivibrator 40 and then from which the stored information is read out under control of an output signal from the one-shot multivibrator 44; and a resistor network 46 constituted by nine resistors $R_{3a}$, $R_{3b}$ $R_{3i}$ . . . of different resistances whose one ends are connected to the output terminals of the corresponding bistable multivibrators $45a$ to $45i$ and a resistor $R_4$ whose one end is connected in common to the other ends of the respective resistors $R_{3a}$ to $R_{3i}$ and whose other end is returned to ground, the nongrounded side of said resistor $R_4$ being coupled to the frequency control element Cv included in the local oscillator 13 and/or the RF amplifier 12.

Assuming the resistance of the first resistor $R_{3a}$ to be $R\Omega$, the present inventors experimentarily proved that those of the remaining resistors $R_{3b}$ to $R_{3i}$ should preferably be selected by an equation $$Rn = \frac{R}{2^{n-1}} (\Omega)$$

(where $n=an$ integer of 1, 2, 3 . . . 9), and that of the resistor $R_4$ at a value much smaller than those of the resistors $R_{3a}$ to $R_{3i}$.

Where voltages read out from the bistable multivibrators $45a$ to $45i$ stood all, for example, at 28 volts, the experiments by the present inventors also found that the oscillation frequencies of the local oscillator 13 and/or the tuning frequencies of the RF amplifier 12 for all the channels (12 channels in this embodiment) would be obtained relatively easily by appropriately combining voltages read out from the bistable multivibrators $45a$ to $45i$ through the operation of the channel selection switch device 16 and by setting the resistances of the respective resistors $R_{3a}$ to $R_{3i}$ and $R_4$ at values as indicated in FIG. 2B.

And said automatic channel selecting section only for the channels now on the air includes a function switch $31_{13}$ arranged in the same manner as the channel selection switches $31_1$ to $31_{12}$ and constituted by a guide member $33_{13}$ which is made of electric conducting material, mounted on the front panel of the TV receiver cabinet and bored with a through hole $32_{13}$ substantially at the center; a mandrel rod $34_{13}$ substantially at the center; a mandrel rod $34_{13}$ substantially at the center; a mandrel rod $34_{13}$ moved through the through hole $32_{13}$ of the guide member $33_{13}$ by the predetermined stroke in the lengthwise direction and having the outer and inner ends engaged with a push button $35_{13}$ made of electric insulating material and with a stopper ring $36_{13}$ respectively; and a coiled spring $37_{13}$ disposed in alignment with the mandrel rod $34_{13}$ whose outer and inner ends are attached to the stopper ring $36_{13}$ and fixed within the TV receiver cabinet respectively.

Said automatic channel selecting section further includes a normally nonconductive npn grounded-emitter transistor Q13 made conductive only when the function switch $31_{13}$ is manipulated, said transistor Q13 having its collector connected to the power supply 38 via a resistor $R1_{13}$ and its base connected to the power supply 38 via a resistor $R2_{13}$ as well as connected to the ground via the guide member $33_{13}$ of the function switch $31_{13}$; a flip-flop or bistable multivibrator 47 triggered by the collector output of the transistor Q13 when this transistor is rendered conductive through the operation of the function switch $31_{13}$ and reset by a rectified IF carrier signal when a first IF carrier after operation of the function switch $31_{13}$ is detected by the IF carrier detector 21 and then rectified by the rectifier 22; and said clock pulse oscillator 20 supplied with the Q output of said bistable multivibrator 47 as an external trigger signal to generate clock pulses which are impressed on said shift register 41 constructed of the bistable multivibrators $41_1$ to $41_{12}$ shifting pulses for sequential channel selection.

FIGS. 2A and 2B jointly show a channel-selecting apparatus of the so-called parallel or simultaneous readout type which is arranged to simultaneously reat out a series of binary coded digital signals stored in the nine parallel disposed binary circuits $FF_{1a}$ to $FF_{1i}$, $FF_{2a}$ to $FF_{2i}$ ... or $FF_{12a}$ to $FF_{12i}$ and nine parallel positioned bistable multivibrators $45a$ to $45a$ upon operation of any of the channel selection switches $31_1$ to $31_{12}$ or of the function switch $31_{13}$.

Figure 3A:
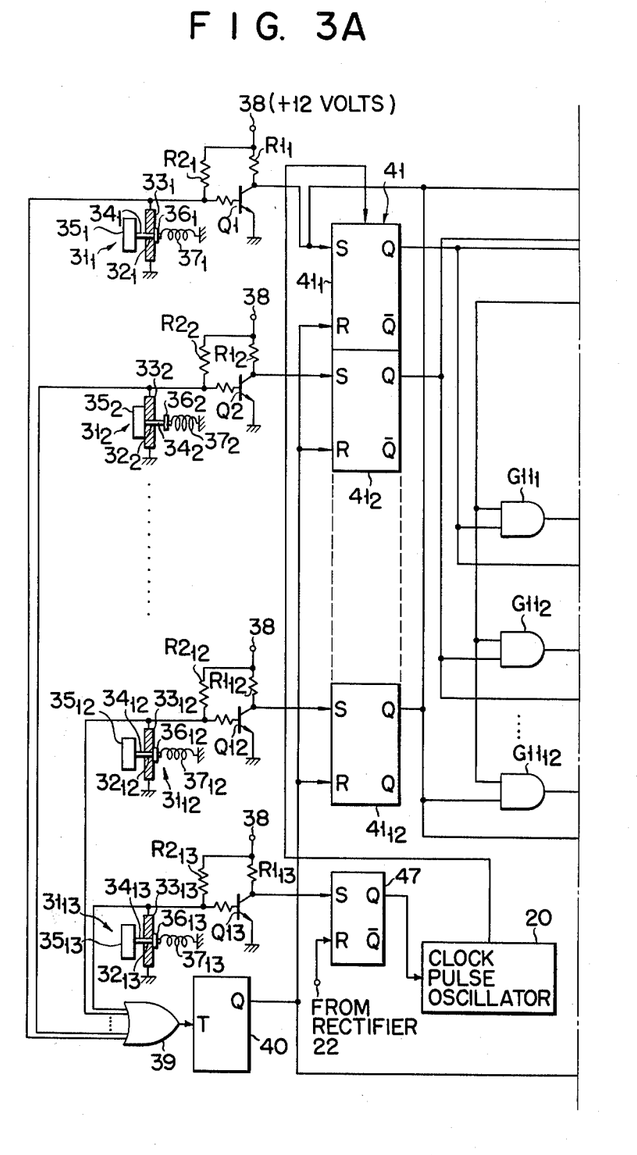
FIGS. 3A and 3B are another practical circuit arrangement of a main part of the channel-selecting apparatus shown in FIG. 1.
Figure 3B:
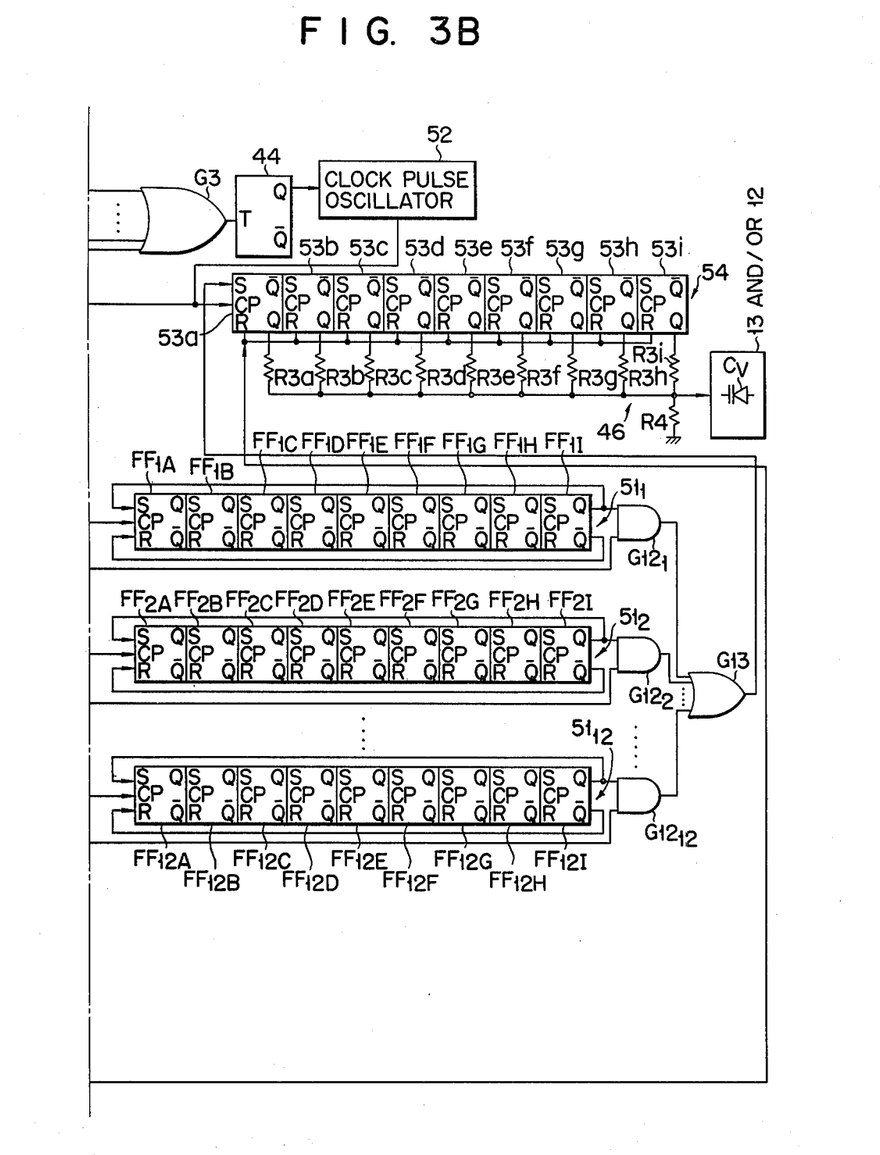

In contrast, FIGS. 3A and 3B jointly illustrate a channel-selecting apparatus of the so-called series or sequential readout type.

In these figures, said digital memory device 17 comprises 12 shift registers $51_1$, $51_2$ ... $51_{12}$ each constructed of nine flip-flops or bistable multivibrators $FF_{1A}$ to $FF_{1I}$, $FF_{2A}$ to $FF_{2I}$ ... or $FF_{12A}$ to $FF_{12I}$ which are cascade-connected to each other and whose last stage outputs are connected to the first stage inputs, in place of the nine parallel arranged binary circuits $FF_{1a}$ to $FF_{1i}$, $FF_{2a}$ to $FF_{2i}$ ... or $FF_{12a}$ to $FF_{12i}$ shown in FIG. 2B; 12 AND gates $G11_1$, $G11_2$ each having an input terminal connected to a Q output of the corresponding one of the bistable multivibrators $41_1$ to $41_{12}$ included in the channel selection device 16 and another input terminal connected to the output terminal of the later described additional clock pulse oscillator 52 which is coupled to the one-shot multivibrator 44 included in the D-A converter 18; twelve AND gates $G12_1$, $G12_2$ ... $G12_{12}$ each having an input terminal connected to the last stage Q output of the nine cascaded bistable multivibrators $FF_{1A}$ to $FF_{1I}$, $FF_{2A}$ to $FF_{2I}$ ... or $FF_{12A}$ to $FF_{12I}$ constituting collectively said shift register $51_1$, $51_2$ ... or $51_{12}$ and another input terminal connected to a Q output of the corresponding one of the bistable multivibrators $41_1$ to $41_2$; and an OR gate G13 having 12 input terminals connected to the output terminals of the corresponding AND gates $G12_1$ to $G12_{12}$.

Said D-A converter 18 in FIG. 3B comprises the OR gate G3 and the one-shot multivibrator 44 constructed in the same manner as in FIG. 2B respectively; the aforesaid additional clock pulse oscillator 52 triggered by an output signal from said one-shot multivibrator 44; and a shift register 54 constructed of nine cascade-connected bistable multivibrators $53a$, $53b$ ... $53i$ in place of the nine parallel arranged bistable multivibrators $45a$ to $45i$ shown in FIG. 2B and carrying out shift operation under control of clock pulses from said clock pulse oscillator 52.

Either output, e.g. a Q output of each of the bistable multivibrators $53a$ to $53i$ is connected in common to the resistor R4 via the corresponding one of the resistors $R_{3a}$ to $R_{3i}$ in the same manner as in FIG. 2B.

The channel selection switch device 16 and the automatic channel-selecting only for the channels now on the air in FIGS. 3A and 3B have the same constructions as those shown in FIGS. 2A and 2B and description thereof is omitted.

In this case, the shift register 41 (FIG. 2A and 3A) constructed of twelve cascaded bistable multivibrators effects shift operation under control of clock pulses from the clock pulse oscillator 20 and the shift registers $51_1$ to $51_{12}$ and 54 (only FIG. 3B) each constituted by nine cascaded bistable multivibrators carry out shift operation under control of clock pulses from the clock pulse oscillator 52.

Accordingly, the clock pulse oscillator 20 must be so constructed as to generate a plurality of clock pulses each time the bistable multivibrator 47 delivers an output trigger signal, and the clock pulse oscillator 52 should produce nine clock pulses each time the one-shot multivibrator 44 generates an output trigger signal.

Figure 4:
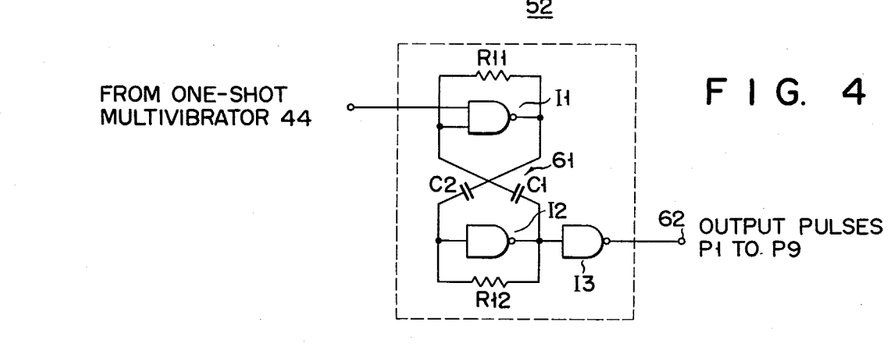
FIG. 4 shows a practical circuit arrangement of a clock pulse oscillator 52 (or 20) shown in FIG. 3B (or FIGS. 2A and 2B)

FIG. 4 shows a practical circuit arrangement of the clock pulse oscillator 52 (or 20) which is designed to carry out the operation as mentioned above.

The clock pulse oscillator 52 (or 20) comprises an externally triggered type astable multivibrator 61 constituted by two inverters I1 and I2 which are cross-coupled by connecting the input terminal of one of the inverters to the output terminal of the other inverter via a capacitor C1 or C2 and each of which is connected with a resistor R11 or R12 between the input and output terminals, the input terminal of either, for example, I1 of the inverters I1 and I2 being supplied with an output signal from the multivibrator 47 (or 44) as an external trigger signal for determining the operable period of the astable multivibrator 61 and the output terminal of either, for example, I2 of the inverters I1 and I2 being connected with an inverter I3 acting as a buffer amplitude.

Figure 5A:
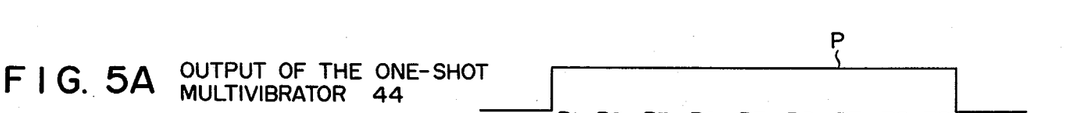
FIGS. 5A and 5B show the input and output waveforms supplied to, and derived from the clock pulse oscillator shown in FIG. 4.

When a pulse signal P having a predetermined time width as shown in FIG. 5A is impressed from the one-shot multivibrator 44, the clock pulse oscillator 52 acts to generate from the output terminal 62 of the inverter I3 clock pulse which have a repetition period $t$ determined by an equation $t \times (C1 \times R11 + C2 \times R12)$.

Figure 5B:
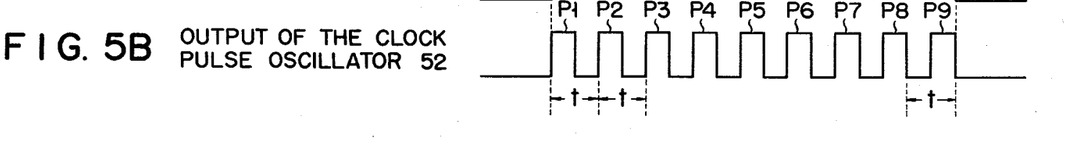

Consequently, the clock pulse oscillator 52 has only to determine the repetition period t of the clock pulses derived therefrom so as to produce nine clock pulses P1, P2 ... P9 as shown in FIG. 5B from the output terminal 62 of the inverter I3 during the on-pulse period of the trigger pulse signal P delivered from the one-shot multivibrator 44. In the same manner, the clock pulse oscillator 20 has only to determine the repetition period $t$ of the clock pulses delivered therefrom so as to generate a desired number of clock pulses from the output terminal 62 of the inverter I3 during the on-pulse period of the trigger pulse signal derived from the bistable multivibrator 47.

The operation of the channel-selecting apparatus constructed as shown in FIGS. 2A–2B or 3A–3B where an individual channel selection is effected will now be described with reference to FIGS. 6A to 6H.

Figures 6A, 6B:
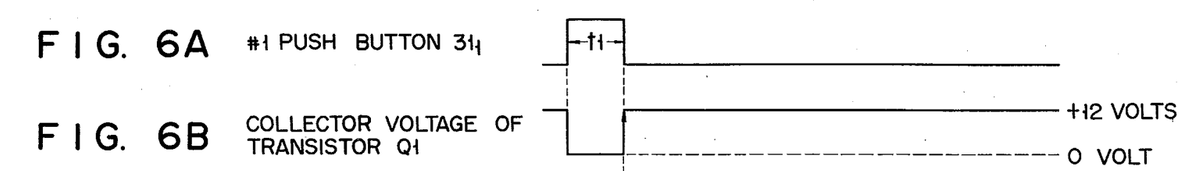
FIGS. 6A to 6H show the waveforms appearing in the circuit portions included in the circuitries of FIGS. 2A–2B and 3A–3B where selection of the individual channels is effected.

Firstly, a desired one, for example, $31_1$ of the channel selection switches $31_1$ to $31_{12}$ is manipulated so that the associated stopper ring $36_1$ is removed from the guide member $33_1$ against the action of the coiled spring $37_1$ and the push-button $35_1$, in place of the stopper ring $36_1$, is engaged with the guide member $33_1$. As a result, the corresponding one Q1 of the normally nonconductive Q1 to C12 is made conductive only during the period t1 (see FIG. 6A) in which the stopper ring 36₁ is removed from the guide member 33₁. Therefore, the collector voltage of the now fired transistor Q1 is changed from +12 volts of the power supply 38 to the ground potential or zero volt only during said period t1 as shown in FIG. 6B.

Figure 6C:
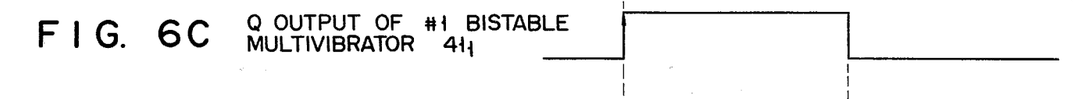
Figure 6D:
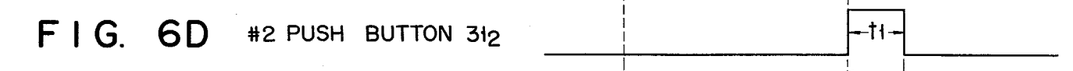

Then, the corresponding one 41₁ of the bistable multivibrators 41₁ to 41₁₂ for operating the associated memory unit 42₁ (FIG. 2A) or shift register 51₁ (FIG. 3B) is brought, as shown in FIG. 6C, to a set state by the transistor Q1 at the time when the stopper ring 36₁ is again engaged with the guide member 33₁ through the action of the coiled spring 37₁ and the collector voltage of the transistor Q1 is returned from the ground potential to the potential of the power supply 38.

In consequence, the one-shot multivibrator 44 (and the clock pulse oscillator 52 only in FIG. 3B) for operating the bistable multivibrators 45a to 45i (FIG. 2B) or 53a to 53i (FIG. 3B) is triggered through the OR gate G3 by the bistable multivibrator 41₁, thereby starting the receiving or selecting period T1 for the desired first channel.

Figures 6E, 6F:
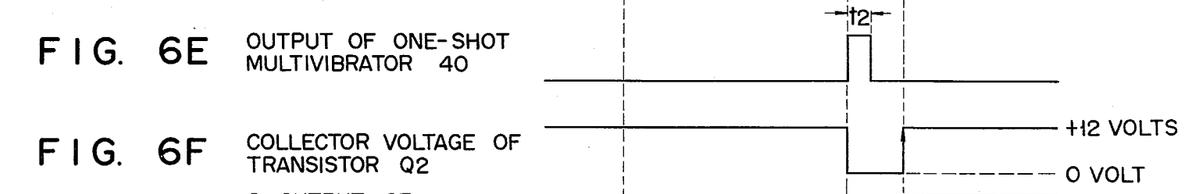

This first channel receiving period T1 is terminated at the time when the push-button 35₂ of a new desired channel, for example, the second channel is depressed and a reset or clear pulse, as shown in FIG. 6E, having a time width t2 shorter than the period t1 obtained through the OR gate 39 and the one-shot multivibrator 40 is commonly supplied to the bistable multivibrators 41₁ to 41₁₂ and 45a to 45i (FIG. 2B) or 53a to 53i (FIG. 3B).

Further, when the push-button 35₂ is depressed, the corresponding transistor Q2 is rendered conductive so as to change the collector voltage thereof from the potential of the power supply 38 to the ground potential only during said period t₁ as shown in FIG. 6F.

Figures 6G, 6H:
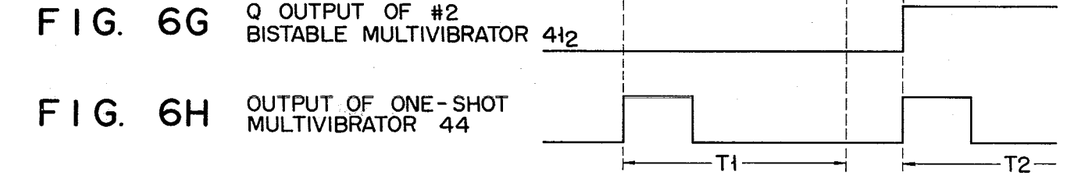

Then, corresponding bistable multivibrator 41₂ is brought to a set condition as shown in FIG. 6G and the one-shot multivibrator 44 is fired through the OR gate G3 as shown in FIG. 6H at the time when the collector voltage of transistor Q2 is returned to the potential of the power supply 38 in the same manner as in the selection of the abovementioned first channel, thereby initiating the receiving period T2 for the second channel.

In the same manner, any of all the channels can be easily selected.

The operation of the channel-selecting apparatus constituted as FIGS. 2A–2B and 3A–3B where an automatic channel selection for the channels now on the air is carried out will now be described with reference to FIGS. 7A to 7I.

In this case, the function switch 31₁₃ has only to be manipulated each time it is desired to select any of the channels only for now on the air.

Figures 7A, 7B:
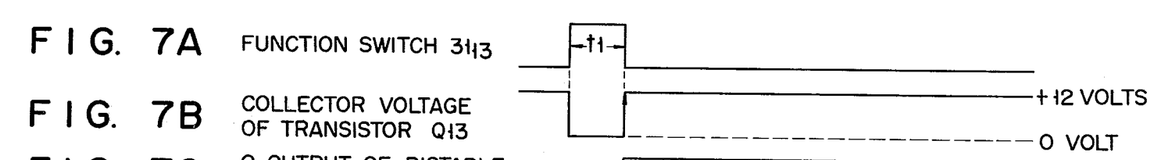
FIGS. 7A to 7I show the waveforms appearing in the circuit portions included in the circuitries of FIGS. 2A–2B and 3A–3B where an automatic selection only for the channels now on the air is effected.

Thus, where the function switch 31₁₃ is operated, the transistor Q13 is brought to a conductive state so as to reduce the collector voltage thereof from +12 volts of the power supply to the ground potential as shown in FIG. 7B only during the period t1, as shown in FIG. 7A, in which the corresponding stopper ring 36₁₃ is removed from the guide member 33₁₃ against the action of the coil spring 37₁₃ in the same manner as in the individual channel selection. Then, the bistable multivibrator 47 is, as shown in FIG. 7C, brought to a set state at the time when the collector voltage of the transistor Q2 is rised back to the potential of the power supply 38, causing the transistor Q12 to be again made nonconductive.

The set state of the bistable multivibrator 47 is continued till the multivibrator 47 is changed to a reset state by the rectified IF carrier signal of a first channel obtained after the operation of the function switch 31₁₃ through the receiving antenna 11, the RF amplifier 12, the mixer 14, the IF amplifier 15, the IF carrier detector 21 and the rectifier 22 (see FIG. 1).

Let it be assumed that the second channel on the air before the operation of the function switch is already in a detectable position and a fifth channel (third and fourth channels are not on the air) is going to be put on the air next time.

Figures 7C, 7D:
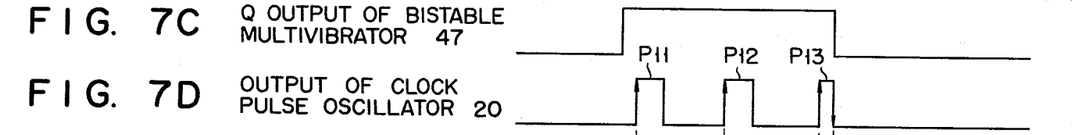
Figure 7E:
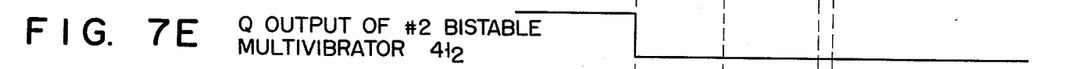
Figure 7F:
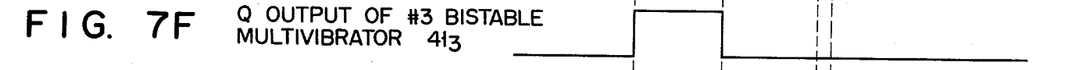
Figure 7G:
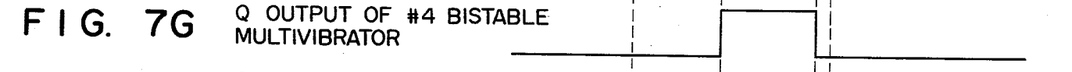
Figure 7H:
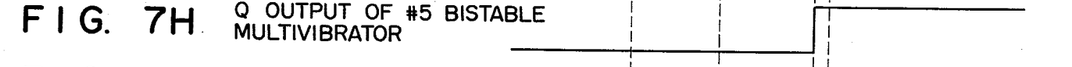

In this case, the bistable multivibrator 47 is kept in a set position as shown in FIG. 7C only during the period in which the clock pulse oscillator 20 generates three clock pulses P11, P12 and P13 (see FIG. 7D) starting from the operation of the function switch 31₁₃.

Accordingly, the bistable multivibrator 41₂ is changed to a reset state (see FIG. 7E) and the receiving period T2 for the original second channel is terminated at the time when the clock pulse oscillator 20 produces the first clock pulse P11. At the same time, the next or succeeding bistable multivibrator (not shown) included in the shift register 41 corresponding to the third channel is brought to a set condition and a selecting period T3 for the third channel is started.

Figure 7I:
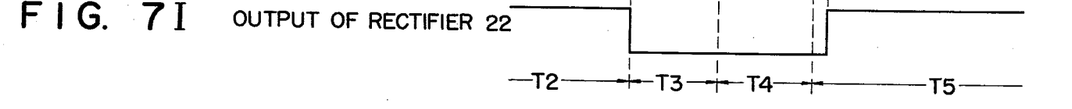

Since the third channel is not on the air, the IF carrier signal rectified by the rectifier 22 disappears at the time the function switch 31₁₃ is manipulated (see FIG. 7I). Therefore, the bistable multivibrator for the third channel is changed to a reset state at the moment the clock pulse oscillator 20 delivers the second clock pulse P12, terminating momentarily the receiving period T3 for the third channel.

At the same time, the succeeding bistable multivibrator (not shown) included in the shift register 41 corresponding to the fourth channel is changed to a set state (see FIG. 7G), whereby a selecting period T4 for the fourth channel is initiated.

Since the fourth channel is also not on the air, the bistable multivibrator for the fourth channel is brought to a reset state at the time the clock pulse oscillator 20 derives that third clock pulse P13, terminating instantaneously the receiving period T4 for the fourth channel.

At the same time, the next bistable multivibrator (not shown) included in the shift register 41 for the fifth channel is changed to a set condition (see FIG. 7H) and a receiving period T5 for the fifth channel is started. Since the fifth channel is now on the air, an IF carrier signal for the fifth channel is again rectified by the rectifier 22 as described above and the bistable multivibrator 47 is changed to a reset position by the rectified IF carrier signal derived from the rectifier 22 immediately after the clock pulse oscillator 20 generates the third clock pulse P13. As a result, the clock pulse oscillator 20 stops or terminates the supply of a next or fourth clock pulse to the shift register 41 and therefore the receiving period T5 for the fifth channel is continued till the function switch 31₁₃ is again manipulated.

As abovementioned, only the channels now on the air can be automatically selected each time the function switch 31₁₃ is operated.

The channel-selecting apparatus of this invention has the advantage of eliminating the necessity of previously adjusting by voltage control elements such as variable resistors as in the prior art analogue dc voltage assigned to all the channels being impressed on the frequency control element Cv provided in the local oscillator 13 and/or the RF amplifier 12, since said digital information representing analogue dc voltages for all the channels are previously stored in the memory devices--17 and converted by the D-A converter 18 into the predetermined analogue voltage for each channel upon operation of the function switch $31_{13}$ or any of the channel selection switches $31_1$ to $31_{12}$.

What we claim is:

1. In a channel-selecting apparatus for a multi-channel receiver designed to determine the oscillation frequencies of a local oscillator and/or the tuning frequencies of a radio-frequency amplifier for all the channels by varying the analogue dc voltages being applied to a frequency control element such as a variable capacitance diode provided in the oscillator and/or the amplifier in accordance with channel selective operation, the improvement being that said channel-selecting apparatus comprises a channel switch means capable of at least individually selecting all the channels; a plurality of digital memory devices being equal in number to the channels coupled with said channel selection switch means, and each comprising a plurality of binary memory units which previously store binary coded digital bit signals equivalent to a predetermined analogue voltage being applied to said frequency control element assigned to the corresponding one of the respective channels, and from which the stored binary coded digital bit signals for the channel selected upon the operation of said channel selection switch means are read out; and a digital-to-analogue converter coupled with said plurality of digital memory devices and said frequency control element by which said binary coded digital bit signals for the selected channel read out from said plurality of digital memory devices are converted into the analogue voltage equal to the binary-weighted sum of the bit signals read out from the selected digital memory device, and from which the converted analogue voltage for the selected channel is supplied to said frequency control element.

2. A channel-selecting apparatus claimed in claim 1, wherein said digital-to-analogue converter comprises a resistor network having a plurality of input terminals each coupled to the corresponding one of said plurality of binary memory units which collectively constitute one of said plurality of digital memory devices, having one common output terminal coupled to said frequency control element, and operative to produce, after once converting the respective binary-coded digital signals read out from said plurality of the selected binary memory units into predetermined different analogue voltages, an analogue voltage having a value equal to the sum of the respective converted analogue voltages.

3. A channel-selecting apparatus claimed in claim 1 wherein said channel selection switch means comprises a plurality of channel selection switches each provided for each of all the channels, a plurality of first normally nonconductive transistors each having an input terminal coupled with the corresponding one of said channel selection switches to be made conductive only upon the operation of the corresponding channel selection switch, a first OR gate having a plurality of input terminals each connected to the input terminal of each of said first normally nonconductive transistors, a first one-shot multivibrator coupled with said first OR gate to be triggered by an output signal therefrom, and a plurality of first bistable multivibrators each coupled with the output terminal of the corresponding one of said first normally nonconductive transistors and said first one-shot multivibrator to be brought to a set state by an output signal from the corresponding first normally nonconductive transistor and to be changed to a reset state by an output signal from said first one-shot multivibrator; said plurality of digital memory devices comprise said binary memory units each constituted by a desired number of a parallel arranged binary circuits which previously store a series of binary coded digital signals equivalent to the predetermined analogue voltage being applied to said frequency control element assigned to each channel, a plurality of AND gate arrangements each constructed of a plurality of AND gates each of which has an input terminal connected to an either output terminal of the corresponding one of said parallel arranged binary circuits constituting one of said memory units and having another input terminal connected to the Q output side of the corresponding one of said first bistable multivibrators, and a plurality of second OR gates each having a plurality of input terminals connected to the output terminals of those of the AND gates constituting said plurality of arrangements which constitute the same stage; and said digital-to-analogue converter comprises a third OR gate having a plurality of input terminals each connected to the Q output side of the corresponding one of said first bistable multivibrators, a second one-shot multivibrator coupled with said third OR gate to be triggered by an output signal therefrom, a plurality of second bistable multivibrators coupled with said first and second one-shot multivibrators and said second OR gates, each of said second bistable multivibrators being brought to a reset position by an output signal from said first one-shot multivibrator, thereafter stored with an output signal derived from the corresponding one of said second OR gates and causing the stored signal to be read out under control of the output signal from said second one-shot multivibrator, and a resistor network constructed of a plurality of first resistors having different predetermined resistances and connected at one end to an either output terminal of the corresponding one of said second bistable multivibrators and of a second resistor having one end connected in common to the other ends of said first resistors and coupled to said frequency control element and having the other end connected to the ground.

4. A channel-selecting apparatus claimed in claim 3 in which said first bistable multivibrators collectively constitute a shift register and which further includes an automatic channel selecting section only for the channels now on the air comprising a carrier detection means for detecting a carrier signal included in a broadcasting wave of the channels now on the air; and additional channel selection switch means operated only upon an automatic selection for the channels now on the air; a second normally nonconductive transistor coupled with said additional channel selection switch means to be made conductive only upon the operation thereof and having the input terminal connected to another input terminal of said first OR gate which has said plurality of input terminals connected to the respective input terminals of said first normally nonconductive transistors; a third bistable multivibrator coupled with said second normally nonconductive transistor and said carrier detection means to be brought to a set state by an output signal delivered from said second normally nonconductive transistor upon the operation of said additional channel selection switch means and to be changed to a rest state in accordance with that carrier signal included in a broadcasting wave of a first channel after the operation of said additional channel selection switch means which is detected by said carrier detection means; and a clock pulse oscillator coupled with said third bistable multivibrator and said shift register constituted by said first bistable multivibrators to start the supply of shift or clock pulses generated thereby to said shift register upon the set state of said third bistable multivibrator and terminate said supply upon the reset state thereof.

5. A channel-selecting apparatus claimed in claim 1 wherein said channel selection switch means comprises a plurality of channel selection switches each provided for each of all the channels, a plurality of first normally nonconductive transistors each having an input terminal coupled with the corresponding one of said channel selection switches to be made conductive only upon the operation of the corresponding channel selection switch, a first OR gate having a plurality of input terminals each connected to the input terminal of each of said first normally nonconductive transistors, a first one-shot multivibrator coupled with said first OR gate to be triggered by an output signal therefrom, and a plurality of first bistable multivibrators each coupled with the output terminal of the corresponding one of said first normally nonconductive transistors and said first one-shot multivibrator to be brought to a set state by an output signal from the corresponding first normally non-conductive transistor and to be changed to a reset state by an output signal from said first one-shot multivibrator; said plurality of digital memory devices comprise a plurality of first AND gates each having an input terminal connected to an either output terminal of the corresponding one of said first bistable multivibrators, a plurality of memory units each comprising a first shift register constructed of a desired number of cascaded binary circuits each of which previously stores a series of binary coded digital signals equivalent to the predetermined analogue voltage being applied to said frequency control element assigned to each channel and is coupled to the corresponding one of said plurality of first AND gates so that the stored digital signals are read out under control of an output signal derived therefrom, a plurality of second AND gates each having an input terminal connected to an either output terminal of the last stage of said corresponding first shift register constituting one of said memory units and having another input terminal connected to an either output terminal of the corresponding one of said first bistable multivibrators, and a second OR gate having a plurality of input terminals each connected to the output terminal of the corresponding one of said plurality of second AND gates; and said digital-to-analogue converter comprises a third OR gate having a plurality of input terminals each connected to an either output terminal of the corresponding one of said first bistable multivibrators, a second one-shot multivibrator triggered by an output signal from said third OR gate, a clock pulse oscillator coupled with said second one-shot multivibrator to generate a desired number of clock pulses upon being triggered by said second one-shot multivibrator, said clock pulse oscillator having the output terminal connected to another input terminal of each of said plurality of first AND gates, a second shift register constructed of a plurality of cascaded bistable multivibrators and coupled with said first one-shot multivibrator, said second OR gate and said clock pulse oscillator to sequentially read in output signals derived from said second OR gate after being reset by an output signal from said first one-shot multivibrator under control of clock pulses generated by said first clock pulse oscillator, and a register network constructed of a plurality of first resistors having different predetermined resistances and connected at one end to an either output terminal of the corresponding one of said bistable multivibrators constituting said second shift register and a second resistor having one end connected to ground and having the other end connected in common to the other ends of said first resistors and coupled with said frequency control elements.

6. A channel-selecting apparatus claimed in claim 5 wherein said first bistable multivibrators collectively constitute a shift register and which further includes an automatic channel selecting section only for the channels now on the air comprising a carrier detection means for detecting a carrier signal included in a broadcasting wave of the channels now on the air; an additional channel selection switch means operated only upon an automatic selection for the channels now on the air; a second normally nonconductive transistor coupled with said additional channel selection switch means to be made conductive only upon the operation thereof and having an input terminal connected to another input terminal of said first OR gate which has said plurality of input terminals connected to the respective input terminals of said first normally nonconductive transistors; a third bistable multivibrator coupled with said second normally nonconductive transistor and said carrier detection means to be brought to a set state by an output signal delivered from said second normally nonconductive transistor upon the operation of said additional channel selection switch means and to be changed to a reset state in accordance with that carrier signal included in a broadcasting wave of a first channel after the operation of said additional channel selection switch means which is detected by said carrier detection means; and a clock pulse oscillator coupled with said third bistable multivibrator and said shift register constituted by said first bistable multivibrators to start the supply of shift or clock pulses generated thereby to said shift register upon the set state of said third bistable multivibrator and terminate said supply upon the reset state thereof.

7. A channel-selecting apparatus claimed in claim 5 wherein said clock pulse oscillator comprises an externally triggered type astable multivibrator.

* * * * *